(12) United States Patent
House et al.

(10) Patent No.: US 6,834,256 B2
(45) Date of Patent: Dec. 21, 2004

(54) METHOD AND SYSTEM FOR DETERMINING MOTOR RELIABILITY

(75) Inventors: Michael Brynn House, Clifton Park, NY (US); Gregory Lee Flickinger, Clairton, PA (US); Calvin Thomas Fritz, Bethlehem, PA (US); Hunt Adams Sutherland, Saratoga Springs, NY (US); Thomas Paul Repoff, Sprakers, NY (US)

(73) Assignee: General Electric Company, Schenectady, NY (US)

( * ) Notice: Subject to any disclaimer, the term of this patent is extended or adjusted under 35 U.S.C. 154(b) by 96 days.

(21) Appl. No.: 10/231,084

(22) Filed: Aug. 30, 2002

(65) Prior Publication Data

US 2004/0044499 A1 Mar. 4, 2004

(51) Int. Cl.[7] .............................................. G06F 19/00
(52) U.S. Cl. ........................ 702/181; 702/179; 702/183; 318/565
(58) Field of Search .......................... 345/713; 703/2–4, 703/13; 702/181, 34–36, 56, 58, 59, 64, 65, 113, 122, 179, 182–185, 187–188; 324/772, 546, 545, 522, 525, 551; 388/909; 318/565, 434, 806; 340/500, 514, 635, 636.13, 648, 657, 664, 680, 682, 683, 3.1; 361/23, 24; 706/14, 50, 911, 912, 914, 915; 700/79, 21, 293, 294

(56) References Cited

U.S. PATENT DOCUMENTS

| | | | |
|---|---|---|---|
| 5,532,601 A | 7/1996 | Weir et al. | 324/539 |
| 5,726,905 A | 3/1998 | Yazici et al. | 702/38 |
| 6,006,170 A | 12/1999 | Marcantonio et al. | 702/182 |
| 6,087,836 A | 7/2000 | Divljakovic et al. | 324/557 |
| 6,172,509 B1 | 1/2001 | Cash et al. | 324/546 |
| 6,236,227 B1 | 5/2001 | Kliman et al. | 324/772 |
| 6,262,550 B1 | 7/2001 | Kliman et al. | 318/565 |
| 6,411,908 B1 | 6/2002 | Talbott | 702/34 |
| 6,446,027 B1 * | 9/2002 | O'Keeffe et al. | 702/183 |
| 6,549,869 B1 * | 4/2003 | Piety et al. | 702/122 |
| 6,553,816 B1 * | 4/2003 | Palanisamy et al. | 73/118.1 |
| 6,646,397 B1 * | 11/2003 | Discenzo | 318/439 |
| 6,681,215 B2 * | 1/2004 | Jammu | 706/21 |
| 2003/0034995 A1 | 2/2003 | Osborn et al. | 345/713 |
| 2003/0137194 A1 * | 7/2003 | White et al. | 307/10.1 |
| 2003/0216888 A1 * | 11/2003 | Ridolfo | 702/181 |

OTHER PUBLICATIONS

G.B. Kliman et al., "A New Approach to On–Line Turn Fault Detection in AC Motors," Proc. 1996 IEEE Industry Applications Society Annual Meeting, pp. 686–693, Oct. 1996.
J. Sottile et al., "Experimental Investigation of On–Line Methods for Incipient Fault Detection," Proc. 2000 IEEE Industry Applications society Annual Meeting, pp. 2682–2687, Oct. 2000.

(List continued on next page.)

Primary Examiner—Hal Wachsman
(74) Attorney, Agent, or Firm—Nixon & Vanderhye PC

(57) ABSTRACT

The reliability and remaining time before failure for electric motor systems and the like is determined with an ascertained statistical confidence based on continually monitored system parameters and a database comprised of historical failure mode/cause and repair data concerning the same motor and/or similar motor systems. A computational process is followed that relies upon hierarchical failure-tree structures, Weibull probability distributions and directed causal networks and which updates the probabilities and models used to forecast the remaining time before system failure based on the monitored parameters. Motor system operational parameter data is continually monitored at the site of the motor system and up-loaded via wireless or other communications network to a remote computer system where a database is maintained and reliability analysis is performed.

29 Claims, 5 Drawing Sheets

OTHER PUBLICATIONS

S. Williamson et al., "Analysis of Cage Induction Motors with Stator Winding Faults," IEEE Trans. on Power Apparatus and Systems, vol. 104, No. 7, pp. 1838–1842, Jul. 1985.

F.C. Trutt et al., "On–Line Condition Monitoring of Induction Motors," Industry Applications Conference, 2001. Thirty–Sixth IAS Annual Meeting. Conference Record of the 2001 IEEE, vol. 2, pp. 1369–1375.

B. Yazici et al., "An Adaptive, On–Line, Statistical Method For Bearing Fault Detection Using Stator Current," In: Industry Applications Conference, 1997. Thirty–Second IAS Annual Meeting, IAS '97., Conference Record of the 1997 IEEE, pp. 213–220, vol. 1 Oct. 5–9, 1997, New Orleans, LA.

L. Yin et al., "Uncertainty Analysis in Reliability Modeling," In: 2001 Proceedings Annual Reliability and Maintainability Symposium, pp. 229–334, 2001, (no month).

K.G. Hunt, "How to Obtain Maximized Predictability of Manufacturing Process Performance through ICAS", 27 pages, (no date).

M.G.M. Madden et al., "Monitoring and Diagnosis of Multiple Incipient Faults Using Fault Tree Induction," Dept. of Mechnical Engineering, University College, Galway, Ireland, 17 pages, (no date).

S.J. Engel et al., "Prognostics, The Real Issues Involved With Predicting Life Remaining," 2000 IEEE, pp. 457–469., (no month).

D.C. Swanson, "A General Prognostic Tracking Algorithm for Predictive Maintenance," 2001 IEEE, Updated Dec. 15, 2000, pp. 6–3971—6–2977.

V.A. Skormin et al., "Data Mining Technology for Failure Prognostic of Avionics," IEEE Transactions on Aerospace and Electronic Systems, vol. 38, No. 2, Apr. 2002, pp. 388–403.

B. Lord et al., "Equipment Health Monitoring Failure Modes Case Study," National Petroleum Show, Jun. 12 to Jun. 15, 2000, Calgary, Alberta Canada,32pages.

* cited by examiner

Example Network for Motor Reliability Testing

METHOD AND SYSTEM FOR DETERMINING MOTOR RELIABILITY

The present invention relates to a system and method for determining reliability and forecasting, with an ascertained statistical confidence, a remaining time before failure for electric motor systems and/or electric coil-wound devices.

BACKGROUND OF THE INVENTION

Acquisition of accurate information concerning the running condition, status and performance of motor systems, such as, for example, electric motors used in "critical" industrial manufacturing processes, power generation systems and the like, is often crucial in maintaining successful commercial operation of such systems. Consequently, considerable efforts are often expended to develop and improve upon existing methods and apparatus used for monitoring and assessing the operation and performance of electric motors and coil devices in such systems. Robust methods of inspection are often desired for such critical process motors, since if a motor must be taken off-line, its inoperability may adversely impact production and manufacturing processes or other revenue generating capacity.

Robust processes for the inspection and predictive maintenance of motor systems usually involve monitoring a variety of operational parameters such as motor current, voltage, vibration, flux leakage, etc. to detect impending failures. Conventionally, one or more parameters are monitored over time and used to trigger a maintenance outage/recommendation when the value of a monitored parameter exceeds a predetermined threshold. The contemporary technological trend is to automate the inspection process by affixing a variety of sensors and transducers to critical process motors to continuously collect information through either off-line monitoring or on-line monitoring techniques. Parameter data for an operating motor may then be tracked continuously and an alarm may be immediately triggered if a predetermined threshold value for a particular parameter is exceeded. For example, vibration amplitude or spectral data that exceeds or drifts from a predetermined range or value can be used to activate an alarm to notify the equipment operator that a particular type of failure mode is imminent. Unfortunately, these conventional inspection and predictive maintenance processes typically target only imminent failures and do not provide a quantitative determination of remaining motor life or motor reliability.

In general, service and repair information acquired as a result of previous inspections and routine maintenance of motor equipment is not compiled for the purpose of performing predictive/prognostic maintenance or conducting a comprehensive analysis of motor health. Conventionally, a motor system expert/specialist simply assesses available historical information and then formulates a maintenance recommendation based on obvious trends and personal experience. A decision to repair or perform maintenance on a particular motor system was based on an estimate of the reliability and usability of the equipment developed primarily from the expert's subjective judgment. In other instances, predictive maintenance is based solely on the number of hours of motor operation or the time since the last maintenance outage, rather than on any condition-based test results. Moreover, even if it was desirable for a motor operator/technician or monitoring specialist to collect test data or parametric operating data from a particular motor system for performing a more detailed analysis, access to conventional digital land line communications for uploading such data is often not available at the motor system site.

The use of motor operational parameter data as a failure predictive tool and to assess motor health has been explored to some extent in the past by various investigators. Different motor system parameters may be used for this purpose and may include motor system "unbalances" such as residual negative sequence impedance, effective negative sequence impedance and voltage mismatch. In one example, the FFT signature of motor current was shown capable of detecting motor bearing failures. In another example, an algorithm for performing cluster analysis on the motor supply current Fast Fourier Transform (FFT) was investigated in the hopes of predicting motor life uncertainty. However, most known conventional methods provide only a general warning of imminent motor failure based on the detection of an alarm condition from a single monitored parameter. Typically, such methods do not provide an assessment of motor reliability, nor do they provide an estimate of the operating time remaining until a repair will be needed.

BRIEF DESCRIPTION OF THE INVENTION

The present invention is directed, at least in part, toward providing a reliable method and means for quantitatively describing the probabilistic and temporal behavior of electrical motor system performance and/or other electric coil-wound system/devices (e.g., electric generators), with an aim toward predicting motor system reliability and time-until-repair with known bounds of statistical confidence. The present invention also is directed, at least in part, toward providing a computer system for analyzing motor operational parameter data in light of historical repair data and failure rate/mode information and a communications network arrangement for acquiring and uploading the operational parameter data from remotely located motor systems to the computer system. In an example embodiment, a computer implemented method is provided for predicting, with statistical confidence, the amount of remaining motor life that may be expected before a repair is necessary (i.e., the time remaining time before expected failure) and for identifying the most probable component or components that will need to be serviced.

As one aspect of the present invention, a computer implemented prognostic process is provided that continually redefines the probabilities used to develop a quantitative forecast of the remaining time before failure for a particular electric motor/coil-wound system. The probabilistic behavior of an electric motor/coil-wound system is analyzed together with its ongoing operational performance to predict system reliability and the remaining time until repair (time-to-repair) with an ascertained statistical confidence. To accomplish this, ongoing operational performance and environmental effects of a particular electric motor/coil-wound system (hereinafter "motor system") are continually monitored and the data acquired is used along with data acquired from historical sources of motor system data to compute reliability and time-to-repair forecasts. Repair records and/or test/performance data histories of the motor system or similar motor systems are used as historical sources motor system data. Information from root-cause failure analysis performed following motor failure incidents covering a variety of motor system components may also be used as a source of historical motor system data. A database comprising the historical motor system data is assembled and checked for quality and the qualifying data is then used in developing constructing a causal reliability model for individual components of the subject motor system. Multidimensional probability density functions are then used to model the life of each of the different motor system components based on data from the historical database. In addition, conditional probabilities of motor system reliability are constructed based on current operational parameter "field data" acquired from a subject motor system through continual real-time monitoring.

The probabilistic models developed may then be used with known computer implemented simulation techniques to perform "what-if" prognostics. For the purpose of assessing the current state of a subject motor system, causal networks of "directed graphs" (e.g., Bayesian Belief Networks) are constructed for at least each of the primary motor system components based upon fault-tree analysis and the identification and selection of the appropriate data acquired from on-site motor system sensors and historical sources. The causal networks are integrated into hierarchical tree structures allowing segmentation of the heterogeneous populations of various monitored motor systems into homogeneous sub-populations for purposes of improving the reliability predictions.

At least one beneficial feature of the present invention includes its ability to quantitatively forecast remaining motor life using reliability calculations that are based on a historical sources of performance/repair information for similar systems. This ability is particularly feasible when a large quantity of documented root cause failure analyses and periodically collected performance data exist to support such an evaluation. Moreover, the quantitative and probabilistic analysis that is provided through an embodiment of the present invention may be used to improve and standardize existing methods of applying expert human judgment and experience. For example, an inexperienced motor monitoring technician may utilize the present invention to obtain a better understanding of a complex impending fault condition for the purpose of performing a quick system diagnosis.

As a further beneficial aspect of the present invention, an "on-line" monitoring arrangement may be used with a subject motor system so that automated performance and/or reliability assessments may be made on a continual basis wherein a remotely located technician is notified of current motor health conditions and updated reliability forecasts. Still another beneficial aspect of the present invention is that it provides for the transmission of remotely monitored motor system data via a plurality of different wired and wireless communications hardware and protocols. A still further aspect of the invention is the provision of a user-friendly interactive graphical I/O interface that can display selected motor data and various computed statistics in an easily-readable fashion. For example, the graphical user-interface may be operated to display computed reliability information, such as remaining motor life determined as a percent of total motor life, in the form of a moving-average graphical "odometer" or a moving bar-graph.

DETAILED DESCRIPTION OF THE INVENTION

Conventional motor servicing and monitoring equipment is used to continually acquire data (in real-time) on a variety of motor system operational parameters such as, for example, voltage, amperage, phase, frequency, total vibration amplitude, torque and slip. Ambient condition data such as atmospheric humidity and temperature may also be acquired and used along with the monitored equipment data for analysis.

Figure 1:
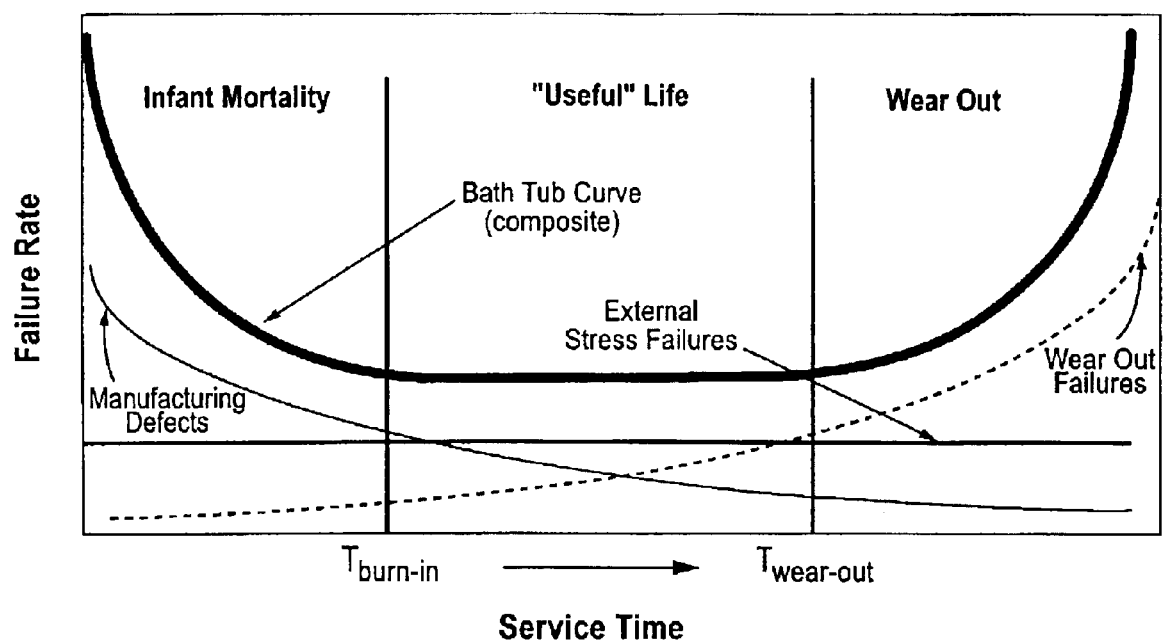
FIG. 1 is a graph illustrating the useful life span of a motor system part as a function of failure rate and time in service.

Conventionally known techniques of system design analysis are employed initially to compute individual part/component reliability. For example, mean-time-to-Failure (MTTF) data and failure probability distribution functions are collected on various parts/components of the motor system and reliability block diagrams are constructed. A system overall reliability distribution, R, is then computed based upon the reliability block diagrams. In this context, the dependence of R may be described as a function of individual parameters, $\lambda_n$, of the system as represented by EQU. 1 below:

$$R = f(\lambda_1, \lambda_2, \ldots \lambda_n) \qquad \text{EQU. (1)}$$

wherein each of the parameters, $\lambda_n$, represent a failure rate of a particular part from the sub-population of motor systems. These system parts/components experience a useful life that may be generally described in terms of a "bath tub" curve, as shown in FIG. 1.

If the failure rates of the system parts are independent, a multiplicative relationship may be used to calculate system reliability, such as described by EQU. 2 below:

$$p(\lambda) = \prod_{i=1}^{k} f(\lambda_i) \qquad \text{EQU. (2)}$$

However, if the failure rates are not independent, then the failure probabilities are described in terms of a matrix of probabilities describing all possible failure events. The matrix is then used to compute the most probable event given input from directed causal networks.

A simulation may be used to compute the joint dependent probability density function (PDF). This approach involves randomly sampling the joint PDF, computing a reliability (R) value for the simulation and then constructing an overall reliability distribution function based on accumulated simulation runs. The part/component life is distributed according to a probability density function and may take the form of an exponential, log-normal or Weibull distribution. A Weibull distribution, as described by EQU. 3 below, is perhaps the most useful due to its flexible shape parameters, $\eta$ and $\beta$:

$$f(t) = \frac{\beta}{\eta} \left(\frac{t}{\eta}\right)^{\beta-1} e^{-\left(\frac{t}{\eta}\right)^{\beta}} \qquad \text{EQU. (3)}$$

The data for the individual probability distributions may be extracted from a database compiled from cataloged root cause failures for a variety of motor components. Conditional probabilities, $f(A(t)|B(t))$, of motor reliability are determined through a collection of field data of the system. (In general, a conditional probability refers to the probability of event B happening, given that event A has already occurred.) The collection of field data from the system may be accomplished, for example, using either on-line or off-line methods of data collection.

Figure 2:
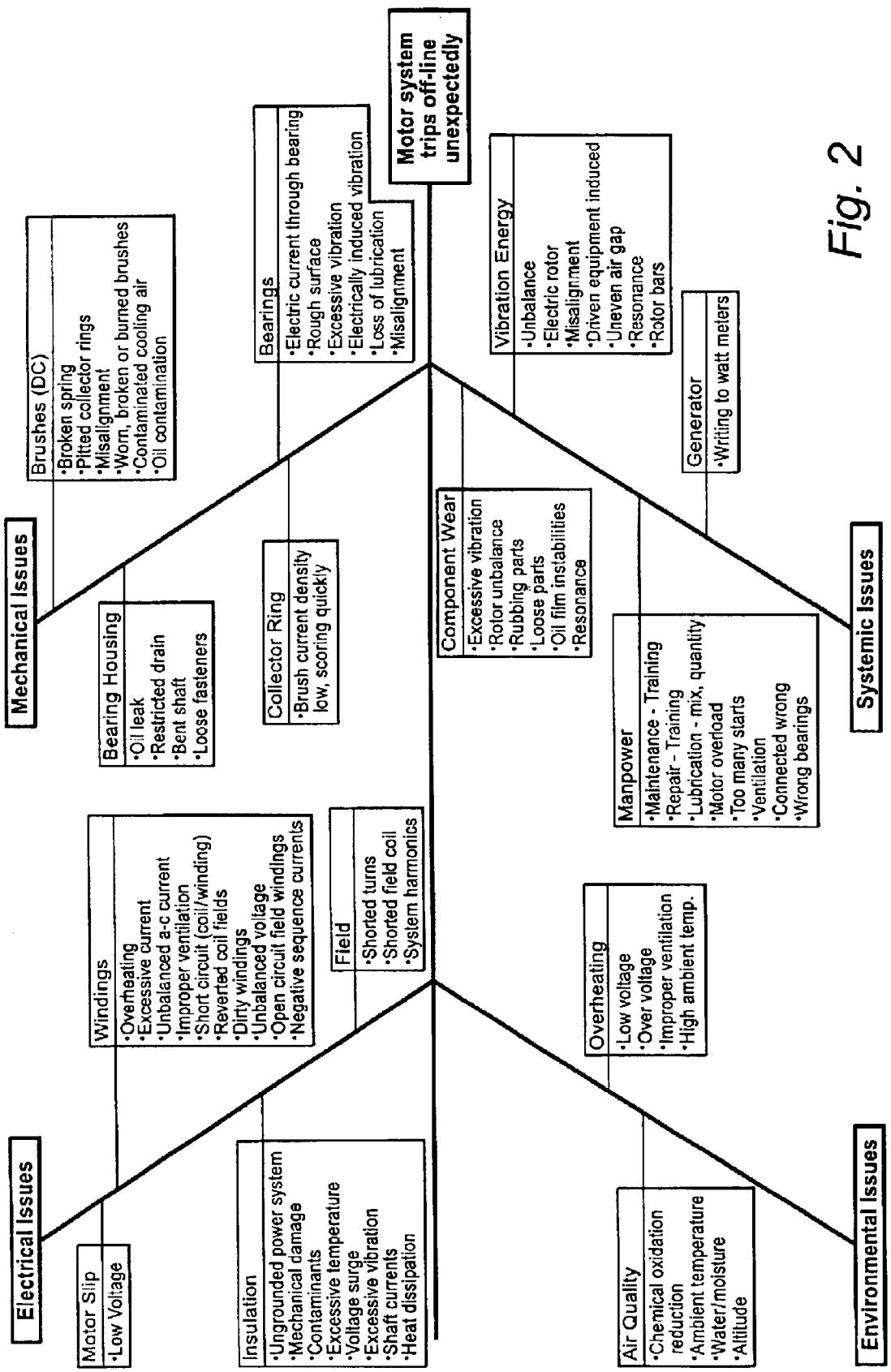
FIG. 2 is a fishbone diagram illustrating example electrical, mechanical, environmental and systemic issues that may cause/contribute to motor system failure.

The "fishbone" diagram shown in FIG. 2 illustrates one example of a system fault-tree analysis that considers various factors and component failure modes which may cause or contribute to an overall motor system failure. Known component failure modes and other causes/factors which have historically caused an electrical motor system or electrical generator to unexpected trip off-line (i.e., an operational shut-down of the system) are listed within one or more cause related subcategories. These fault-tree subcategories are further organized according to more general fault issue classes/categories that are indicative, for example, of whether the cause of failure is related to either Systemic, Environmental, Electrical or Mechanical issues. Preferably, the various component failure modes and causes of faults used in the fault-tree analysis are developed from and based upon historical empirical data, tests and observations collected over a reasonable period of time from a plurality of motor systems.

Figure 3A:
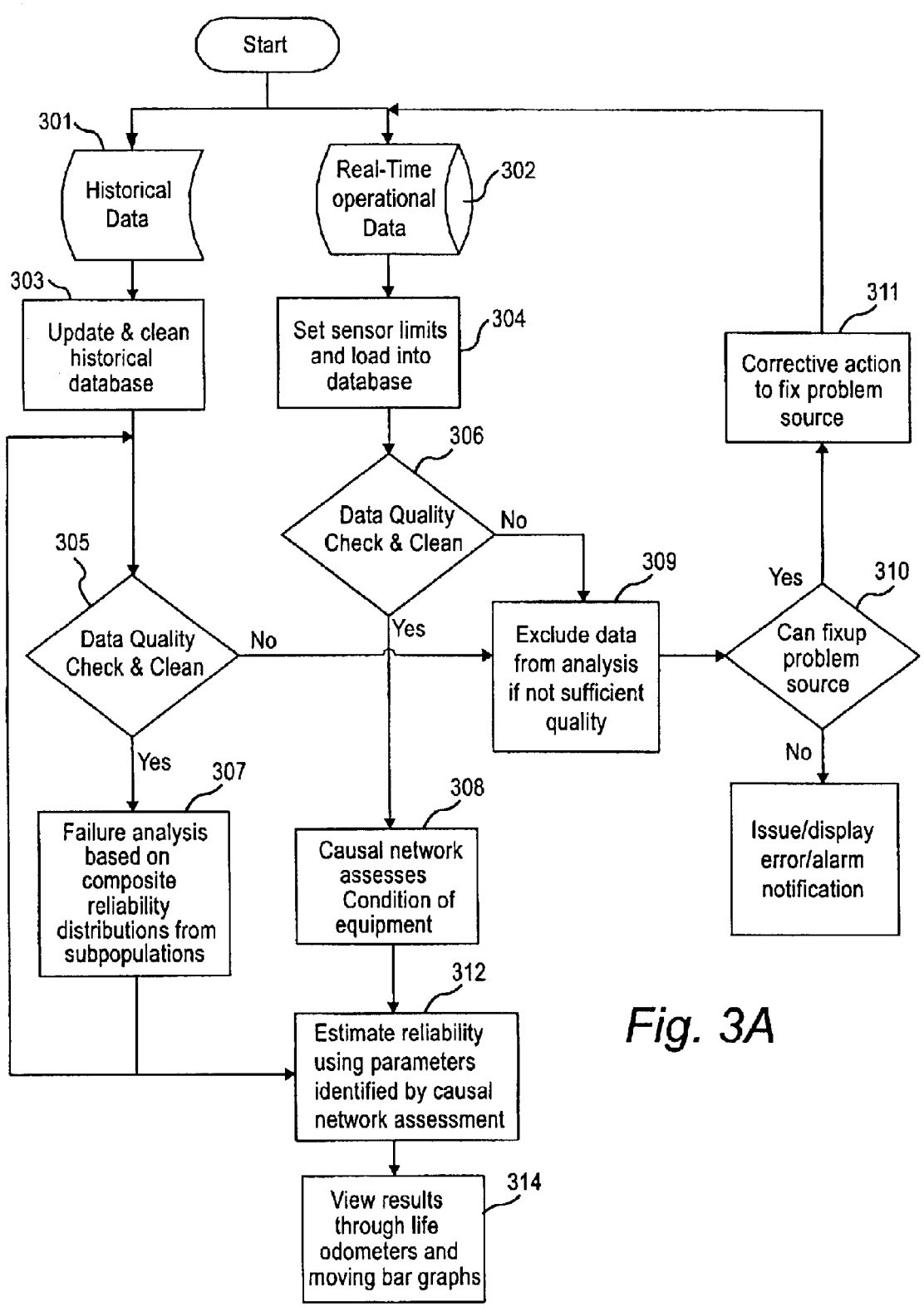
FIG. 3A is a high-level flow diagram illustrating general computer-implemented processes of an example embodiment of the method of the present invention.

FIG. 3A shows a high level flow diagram illustrating the general computer-implemented processes of an example embodiment of the method of the present invention for determining motor reliability. The process initially involves acquiring and organizing historical motor repair data (301) corresponding to the same or similar motor systems into a database (303) and then updating and "cleaning" the database to remove any erroneous or irrelevant data. Data quality checking is performed (305) and any data which does not meet a predetermined quality criterion is excluded from use in the current analysis (309). If a problem or source of the poor quality data is identifiable (310), a notification or alarm may be provided and corrective action may be taken (311) before additional operational or historical data is acquired.

Assuming data quality is acceptable, failure analysis for the motor system is than performed based on a composite of reliability distributions corresponding to various sub-populations of electrical, mechanical, environmental and systemic fault issues/failure modes. In addition, ongoing current operational parameter data is continually monitored and acquired (302) in real-time from sensors at the subject motor system for which a reliability and time-to-failure assessment is desired. This real-time acquired operational data is compiled in another database (302) (or integrated into the historical database) and continually updated. Specific data ranges and limits or calculated metrics for particular motor parameters may also be set and monitored in the database and used, for example, to trigger a notification/alarm condition when appropriate (304).

Data quality checks and data purging may also be performed (306). Assuming the data meets predetermined quality criterion, causal network analysis is performed to assess motor equipment condition that identifies likely developing failure modes (308) and then the results of reliability analysis from the historical data is integrated/combined and correlated with results from the casual network analysis and used to develop a statistically reliable prediction of the time remaining before failure (312). One implementation is to compute the Maximum Likelihood Estimate (MLE) of the Weibull reliability parameters for the system and/or the equipment components identified by the causal network. The computed statistical estimations of system reliability and time remaining before failure may be displayed using conventional computer I/O interface/display devices. In one preferred example embodiment of the invention, the time remaining before failure and computed reliability are displayed using dynamic graphical images such as moving bar graphs and changing data odometers (314).

In general, the various data validation and calibration procedures steps (e.g., 305, 306) are not essential or required, but the use of such tends to improve both the failure analysis and the causal networks relied upon for developing the statistical predictions of reliability.

Figure 3B:
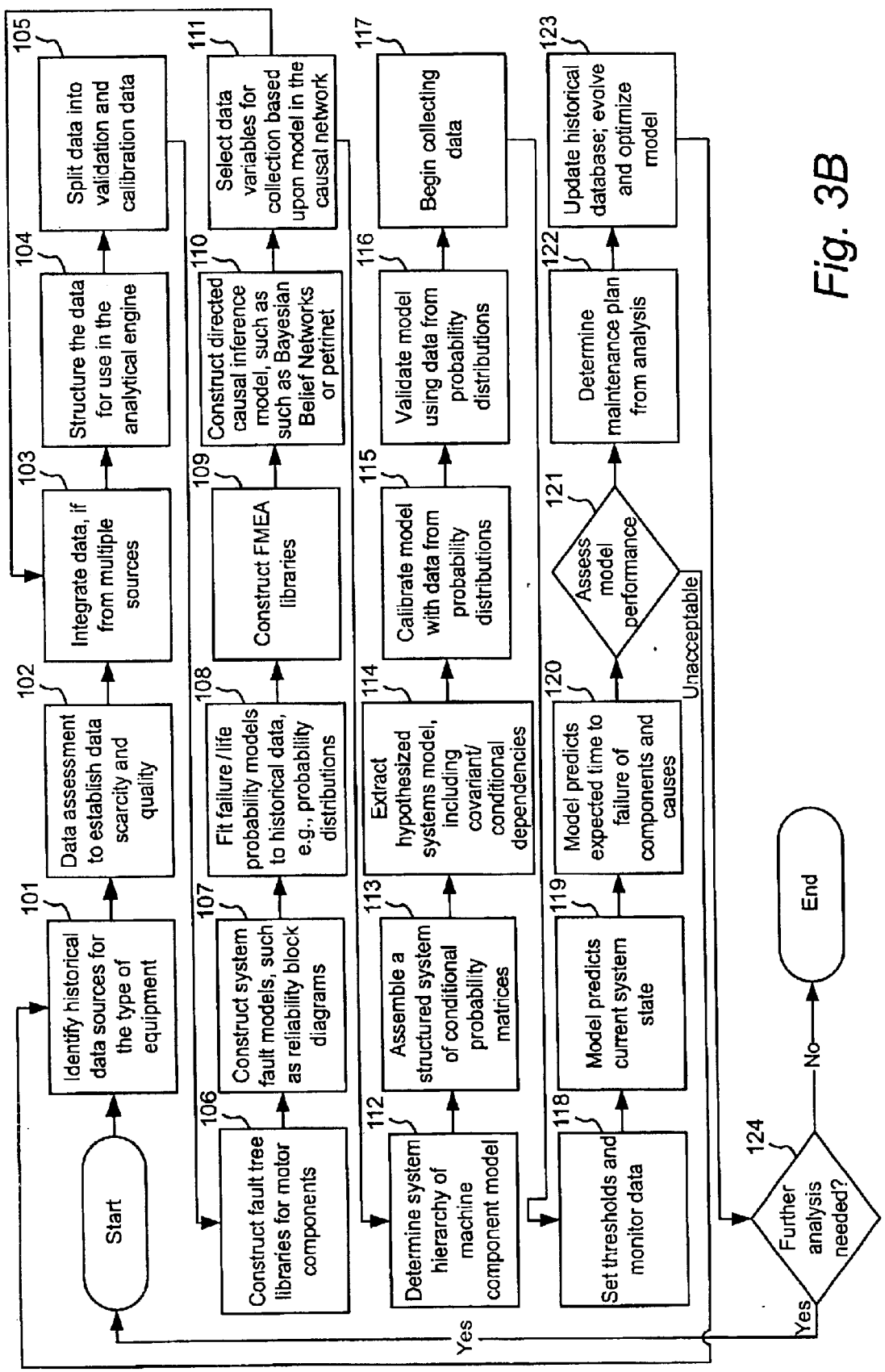
FIG. 3B is a detailed flow diagram illustrating computer-implemented processes of an example embodiment of the method of the present invention.
Figure 4:
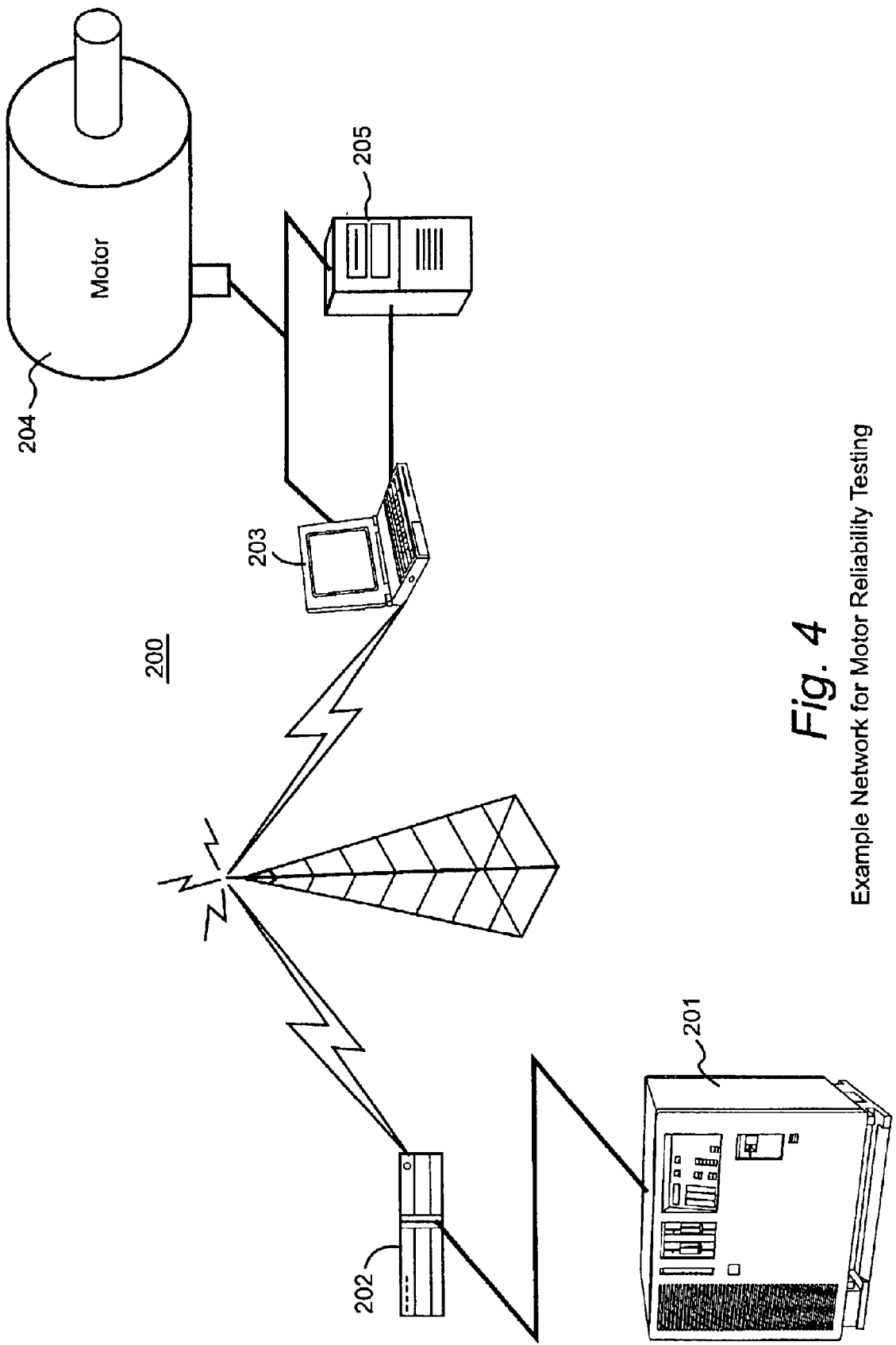
FIG. 4 is a diagram illustrating an example of a data collection network arrangement in which the method of the present invention may be implemented.

FIG. 3B provides a more detailed procedural flow diagram that illustrates an example process for computing motor reliability and predicting time-to-next-repair (or failure). Initially, as indicated at block 101, historical data sources such as, for example, historical test data and/or failure analysis records acquired over a period of time for the type of motor equipment system being evaluated are identified and a historical database of part/component failure rate data is compiled. In one example embodiment of the invention discussed herein, the historical database is maintained and motor reliability computations are performed on a computer system that is remote from the motor system site (FIG. 4). The historical database may also be updated by manual data transfer means using, for example, conventional removable storage media (e.g., CD ROM).

Procedural blocks 102 through 111 of FIG. 3B represent general data preprocessing steps performed to structure and combine historical motor data used later for reliability computations. For example, historical data sources for the particular type of system/equipment analyzed are first identified (block 101) and the data is assessed to determine scarcity and quality of parts (block 102). The historical data is integrated if acquired from multiple sources (block 103) and structured for use by the analytical engine (block 104). The data is split into validation and calibration type data (block 105) and fault tree libraries are constructed for the various motor system components (block 106). Next, system fault models (e.g., reliability block diagrams) are constructed (block 107) and the failure/life-span probability models are fit to the historical data (e.g., using probability distribution) (block 108). Next, the construction of Failure Modes and Effects Analysis (FMEA) libraries is performed (block 109) to identify common failure modes and to assist in the construction of the causal networks used to compute conditional probability of motor component of degradation. A directed causal inference model, such as Bayesian Belief Networks or Petrinet, is constructed (block 110) and data variables are selected for collection based upon the model used in the causal network (block 111).

Blocks 112 through 114 of FIG. 3B illustrate procedural steps for segmenting the motor system by component and establishing dependencies within the causal network. For example, the system hierarchy of the machine component model is determined (block 112), a structured system of conditional probability matrices is assembled (block 113) and a hypothesized systems model that includes covariant/conditional dependencies is extracted (114). Next, in procedural blocks 115 and 116, the systems model is properly calibrated with respect to the particular motor system under investigation. For example, the systems model is calibrated with data from probability distributions (block 115) and then validated using data from probability distributions (block 116).

Block 117 of FIG. 3B represents the initiation of a procedural stage of "field data" collection from the sensors and systems that are attached to the particular motor system under analysis. At this point, current operational/test data is obtained and/or collected directly at/from the particular motor system under analysis and forwarded via wireline or wireless communications link to the remote computer system which performs the analysis. This "field data" may be collected from sensors on the motor or other conventional means at the motor system site. As illustrated in the following procedural block 118, motor system thresholds and alarm limits are constructed/set-up and the field data from the motor system is monitored. If the set thresholds or alarm limits are exceeded, some form of real-time feedback, e.g., an alarm notification, is immediately provided to a monitoring data analyst. Next, as illustrated in procedural block 119, the "state" of the motor system is computed based on the causal network, the thresholds and the monitor data acquired (block 118). The expected time-to-failure and expected failure cause of the various motor system components are then predicted (block 120) by using the system model of covariant/conditional dependencies.

Next, as illustrated in FIG. 3B by procedural blocks 121 and 122, decision points are reached whereby a monitoring data analyst will have to evaluate any alarm conditions and/or assess the model's performance and also make decisions as to repair or to replace components (e.g., develop a maintenance plan) in the light of considering the relevant economic trade-offs and cost optimization goals. If it appears that the model is inaccurate or unrealistic, the whole process may need to be re-initiated (101) and further historical data acquired to improve the predictions. In this regard, procedural blocks 123 and 124 also illustrate further steps, which may be taken to improve the predicting capabilities of the causal networks and optimize the reliability model.

An example motor diagnostic system and physical network (200) in which the method of the present invention may be implemented is shown in FIG. 4. In this example, a remote diagnostic computer system 201 for hosting a database of motor system failure rate information (historical database) and for computing motor reliability according to the method of the present invention is coupled to motor sensors located at the motor system site via a landline or wireless communications network. A communications server 202 may be used to handle exchange of digital information between the motor system site and the remote diagnostic computer system. A laptop computer or other suitable portable diagnostic device 203 used at the motor system site may be used to acquire field data directly from motor or motor sensors 204 and provide acquired motor operating parameter data to remote diagnostic computer system 201 via landline or a wireless communications link (e.g., cell phone, Internet or other wireless connection). Alternatively, field data may be collected from motor 204 by an on-site motor control system or motor monitoring/diagnostic system 205 and up-loaded via landline or wireless link to remote computer system 201 and/or a remote database.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for determining reliability and a remaining time before failure with statistical confidence for an electric motor system, comprising steps performed by a computer system of:
    acquiring and organizing historical motor repair data corresponding to the motor system into a computer system database;
    continually monitoring and uploading operational parameter data from sensors at the motor system to the computer system;
    performing failure analysis based on a composite of reliability probability distributions corresponding to predetermined sub-populations of historical motor system failure causes;
    developing a causal network for modeling reliability of one or more motor system components and assessing motor system component condition based on the causal network;
    performing an integrated causal network and reliability analysis of the motor system, wherein results from performing failure analysis based on historical data are integrated with analysis results based on the causal network to compute a quantitative value for a time remaining before failure with an ascertained statistical confidence; and
    outputting the computed value on a display device associated with the computer system.

2. The method according to claim 1 wherein a Bayesian Belief Network is used as a causal network for modeling reliability.

3. The method according to claim 1 wherein a Petrinet is used as a causal network for modeling reliability.

4. The method according to claim 1 wherein the step of performing failure analysis comprises modeling a failure rate of one or more system components using a Weibull probability distribution function.

5. The method according to claim 1 wherein a portable computer is used to collect motor operational parameter data from sensors at the motor system site and collected data is uploaded via landline or a wireless communications link to a remote computer system.

6. The method according to claim 1 further including the step of providing a graphical user interface that displays remaining time before failure and/or predicted motor life as a graphical odometer.

7. The method according to claim 1 further including the step of providing a graphical user interface that displays remaining time before failure and/or predicted motor life as a moving bar-graph.

8. A method for assessing reliability and determining, with a statistical degree of confidence, a quantitative value for time remaining before failure for an electric motor system and/or electric motor driven equipment, comprising the steps of:
    storing motor system component failure data in a computer data base, said failure rate data based on historical test data and/or failure analysis of similar or identical motor systems and motor components;
    performing a motor system fault-tree analysis based on data assembled in the component failure data base;
    developing one or more motor system component fault models based on said motor system fault tree analysis;
    modeling the historical failure data of one or more motor system components using one or more conventional probability distribution functions;
    developing a directed casual inference model and selecting system variables used for collecting data based on said casual inference model;
    developing a conditional probability matrix comprising failure probabilities corresponding to possible failure events for said motor system;
    developing an overall motor system reliability model based on said casual inference model and said conditional probability matrix; and
    computing a statistical assessment of reliability of the motor system and a quantitative value for time remaining before failure using said overall motor system reliability model.

9. The method according to claim 8 wherein, as a result of determining said statistical assessment of reliability, one or more motor system components are identified as a most probable candidate for needing service or replacement at a predicted time of system failure.

10. The method according to claim 8 wherein the motor system failure data is stored on a computer system remote from the site of the motor system and sensor data is forwarded via wireline or wireless communications link to the remote computer system.

11. The method according to claim 8 wherein the historical failure data is modeled using one or more Weibull probability distribution functions and further includes the step of determining appropriate values for individual Weibull shape parameters to fit said Weibull probability distribution functions to failure data corresponding to individual system components.

12. The method according to claim 8 further comprising the step of updating the historical failure information data base with information obtained through root cause failure analysis performed at times of preventive maintenance or repair of the motor system.

13. The method according to claim 8 wherein motor system operational parameter data is acquired using one or more operational parameter sensors located at the motor system site.

14. The method according to claim 8 wherein a portable computer is used to collect motor operational parameter data from sensors at the motor system site and collected data is uploaded via wireline or a wireless communications link to a remote computer system.

15. The method according to claim 8 further including the step of providing a graphical user interface that displays remaining and/or predicted motor life as a graphical odometer.

16. The method according to claim 8 further including the step of providing a graphical user interface that displays remaining and/or predicted motor life as a moving bar-graph.

17. The method according to claim 8 wherein the historical failure data of one or more system components is modeled using a Weibull probability distribution function.

18. The method according to claim 8 wherein a directed casual inference model is developed using a Bayesian Belief Network.

19. The method according to claim 8 wherein a directed casual inference model is developed using a Petrinet casual network for modeling reliability.

20. A computer-implemented method for determining electrical motor system reliability with an ascertained statistical confidence, comprising:

modeling historical failure data of one or more system components using one or more conventional probability distribution functions;

developing a motor system reliability model based on historical failure data, causal inference models of motor system failure and conditional probabilities describing possible failure events:

collecting motor operational parameter data acquired via motor system sensors located at the motor system site;

evaluating a present state of motor system reliability using the motor system reliability model and collected operational parameter data; and computing a statistical assessment of motor system reliability and a quantitative value for time remaining before failure using the motor system reliability model.

21. The method of claim 20 wherein the system reliability model is based at least in part on a motor system component reliability hierarchy, wherein the motor system component reliability hierarchy is determined from a motor system fault tree.

22. The method of claim 20 wherein a quantitative value for a time remaining before motor system failure is computed and a statistical reliability of the motor system is provided within an ascertained degree of statistical confidence.

23. The method of claim 20 wherein failure data is based at least in part on historical test data and/or failure analysis of similar or identical motor systems and motor components.

24. The method of claim 20 wherein historical failure data of one or more system components is modeled using a Weilbull probability distribution function.

25. The method of claim 20 wherein a Bayesian Belief Network is used to construct a casual inference model for failure events.

26. The method of claim 20 wherein a Petrinet casual network is used to construct a casual inference model for failure events.

27. The method according to claim 20 wherein a portable computer is used to collect motor operational parameter data from sensors at the motor system site and collected data is uploaded via landline or a wireless communications link to a remote computer system.

28. The method according to claim 20 further including the step of providing a graphical user interface that displays remaining time before failure and/or predicted motor life as a graphical odometer.

29. The method according to claim 20 further including the step of providing a graphical user interface that displays remaining time before failure and/or predicted motor life as a moving bar-graph.

* * * * *